(12) United States Patent
Klausmann et al.

(10) Patent No.: US 6,887,733 B2
(45) Date of Patent: May 3, 2005

(54) METHOD OF FABRICATING ELECTRONIC DEVICES

(75) Inventors: Hagen Klausmann, Penang (MY); Bernd Fritz, Penang (MY)

(73) Assignee: Osram Opto Semiconductors (Malaysia) Sdn. Bhd, Penang (MY)

(*) Notice: Subject to any disclaimer, the term of this patent is extended or adjusted under 35 U.S.C. 154(b) by 70 days.

(21) Appl. No.: 10/242,068

(22) Filed: Sep. 11, 2002

(65) Prior Publication Data

US 2004/0048037 A1 Mar. 11, 2004

(51) Int. Cl.⁷ .......................... H01L 21/00; H01L 21/20
(52) U.S. Cl. ..................... 438/50; 438/53; 438/89; 438/109
(58) Field of Search ............... 438/99, 102, 89, 438/84, 50, 53

(56) References Cited

U.S. PATENT DOCUMENTS

| | | | |
|---|---|---|---|
| 5,018,048 A | | 5/1991 | Shaw et al. |
| 5,032,472 A | * | 7/1991 | Michel et al. ............... 428/704 |
| 5,079,200 A | * | 1/1992 | Jackson ....................... 501/136 |
| 5,107,174 A | * | 4/1992 | Galluzzi et al. ............. 313/503 |
| 5,125,138 A | | 6/1992 | Shaw et al. |
| 5,192,240 A | * | 3/1993 | Komatsu ...................... 445/24 |
| 5,508,586 A | | 4/1996 | Martelli et al. |
| 5,520,564 A | * | 5/1996 | DeMars ........................ 446/15 |
| 5,686,360 A | | 11/1997 | Harvey, III et al. |
| 5,701,055 A | | 12/1997 | Nagayama et al. |
| 5,725,909 A | | 3/1998 | Shaw et al. |
| 5,731,661 A | | 3/1998 | So et al. |
| 5,757,126 A | | 5/1998 | Harvey, III et al. |
| 5,771,562 A | | 6/1998 | Harvey, III et al. |
| 5,811,177 A | | 9/1998 | Shi et al. |

(Continued)

FOREIGN PATENT DOCUMENTS

| | | | |
|---|---|---|---|
| EP | 0776 147 | 11/1996 | |
| WO | WO00/36661 | 6/2000 | |
| WO | WO00/36665 | 6/2000 | |
| WO | WO 01/19142 A1 | 3/2001 | ........... H05B/33/04 |

OTHER PUBLICATIONS

Werner ESPE, Max Knoll, Marshall P. Wilder, "Getter Materials for Electron Tubes", Oct. 1950, Electronics, p. 80–86.

Sato, Y. et al., "Stability of Organic Electroluminescent Diodes," Molecular Crystals and Liquid Crystals, vol. 253, 1994, pp. 143–150.

*Primary Examiner*—Michael Lebentritt
(74) *Attorney, Agent, or Firm*—Fish & Richardson P.C.

(57) ABSTRACT

A method of encapsulating an organic device including flash evaporating a getter layer on the substrate is disclosed. The getter layer comprises an alkaline earth metal, such as barium. The getter layer serves to protect the active components by absorbing surrounding moisture and gases.

32 Claims, 3 Drawing Sheets

U.S. PATENT DOCUMENTS

| | | | | |
|---|---|---|---|---|
| 5,844,363 | A | 12/1998 | Gu et al. | |
| 5,855,994 | A | 1/1999 | Biebuyck et al. | |
| 5,882,761 | A | 3/1999 | Kawami et al. | 428/69 |
| 5,895,228 | A | 4/1999 | Biebuyck et al. | |
| 5,936,342 | A | 8/1999 | Ono et al. | |
| 5,945,174 | A | 8/1999 | Shaw et al. | |
| 5,977,895 | A | 11/1999 | Murota et al. | |
| 6,005,692 | A | 12/1999 | Stahl | |
| 6,010,751 | A | 1/2000 | Shaw et al. | |
| 6,042,443 | A * | 3/2000 | Carella et al. | 445/24 |
| 6,080,031 | A | 6/2000 | Rogers et al. | |
| 6,083,628 | A | 7/2000 | Yializis | |
| 6,099,746 | A | 8/2000 | Kim | |
| 6,104,138 | A * | 8/2000 | Martelli et al. | 313/546 |
| 6,137,220 | A | 10/2000 | Nagayama et al. | |
| 6,177,352 | B1 | 1/2001 | Schönfeld et al. | |
| 6,198,217 | B1 | 3/2001 | Suzuki et al. | |
| 6,198,220 | B1 | 3/2001 | Jones et al. | |
| 6,214,422 | B1 | 4/2001 | Yializis | |
| 6,218,004 | B1 | 4/2001 | Shaw et al. | |
| 6,221,456 | B1 | 4/2001 | Pogorski et al. | |
| 6,224,948 | B1 | 5/2001 | Affinito | |
| 6,228,436 | B1 | 5/2001 | Affinito | |
| 6,231,939 | B1 | 5/2001 | Shaw et al. | |
| 6,232,178 | B1 | 5/2001 | Yamamoto | |
| 6,278,234 | B1 | 8/2001 | Ono et al. | |
| 6,563,262 | B1 | 5/2003 | Cao | |
| 6,605,893 | B2 | 8/2003 | Ando | |
| 6,614,057 | B2 | 9/2003 | Silvernail et al. | |
| 6,617,611 | B2 | 9/2003 | Hasegawa et al. | |
| 6,620,513 | B2 | 9/2003 | Yuyama et al. | |
| 6,628,086 | B2 | 9/2003 | Hayashi et al. | |
| 2002/0015818 | A1 | 2/2002 | Takahashi et al. | |
| 2003/0058192 | A1 | 3/2003 | Arai et al. | |
| 2003/0094607 | A1 | 5/2003 | Guenther et al. | |
| 2003/0197197 | A1 | 10/2003 | Brown et al. | |
| 2003/0205845 | A1 | 11/2003 | Pichler et al. | |
| 2003/0209979 | A1 | 11/2003 | Guenther et al. | |
| 2004/0046500 | A1 | 3/2004 | Stegamat | |
| 2004/0048033 | A1 | 3/2004 | Klausmann et al. | |
| 2004/0051449 | A1 | 3/2004 | Klausmann et al. | |

* cited by examiner

METHOD OF FABRICATING ELECTRONIC DEVICES

CROSS REFERENCE TO RELATED APPLICATIONS

This application is related to the following applications being filed concurrently:

U.S. Ser. No. 10/242,004, entitled "ENCAPSULATION FOR ORGANIC DEVICES" by Hagen Klausmann, Yuen Sin Lew, Hou Siong Tan and Hooi Bin Lim; U.S. Ser. No. 10/242,004, entitled "OLED DEVICES WITH IMPROVED ENCAPSULATION" by Hagen Klausmann and Bernd Fritz; and U.S. Ser. No. 10/242,656, entitled "ACTIVE ELECTRONIC DEVICES" by Reza Stegamat. All of these applications are incorporated by reference herein in their entirety.

FIELD OF THE INVENTION

The invention relates to the organic devices, such as organic light emitting diode (OLED) devices. More specifically, the invention relates to the fabrication of organic devices, which require protection from moisture, gases or other atmospheric elements.

BACKGROUND OF THE INVENTION

Various types of devices may require hermetic sealing to protect the active components from atmospheric elements, such as moisture and/or gases. For example, devices which include organic active elements such as OLEDs require protection from moisture or gases. OLED devices can serve as displays for various types of consumer electronic products, such as automobile stereo displays, cellular phones, cellular smart phones, personal organizers, pagers, advertising panels, touch screen displays, teleconferencing and multimedia products, virtual reality products and display kiosks.

Referring to FIG. 1, a conventional OLED device is shown. The OLED device comprises a functional stack formed on a substrate 101. The functional stack comprises one or more organic functional layers 102 between two conductive layers (104 and 106) which serve as electrodes. The conductive layers are patterned to form rows of cathodes in a first direction and columns of anodes in a second direction. OLED cells are located in the active region where the cathodes and anodes overlap. Charge carriers are injected through the cathodes and anodes via bond pads 108 for recombination in the functional organic layers. The recombination of the charge carriers causes the functional layers of the cells to emit visible radiation.

Active components, such as the cathode and organic layers in organic devices are adversely impacted by potentially deleterious components such as water, oxygen and other gaseous components. One approach is to hermetically encapsulate the device with a cap 110, sealing the cells. Typically, an epoxy based sealant 111 is used to bond the cap to the substrate. However, the sealant can be penetrated by potentially deleterious components such as moisture, oxygen and other gases. Small amounts of such deleterious components can be trapped in the encapsulation during the sealing process. Additionally, such deleterious components may diffuse into the encapsulation over time. This can adversely impact the reliability of the OLED device.

To improve the sealing of the encapsulation, a drying agent 114, such as barium oxide, calcium oxide or sodium oxide, may be provided. However, these compounds react with water only, and cannot serve to remove residual gases such as oxygen. Reaction with water disadvantageously forms products that will adversely impact the device layers if they are not packaged and separated from the device layers. The packaging material poses an additional barrier through which water and gases have to permeate to be absorbed, hence reducing the speed and efficiency of absorption. Such restrictions will also lead to bulkier OLED devices and a reduction in efficiency of the fabrication process. Drying agents such as zeolite or silica gel absorb mainly water and not reactive gases. At high temperatures, these drying agents disadvantageously discharge the absorbed moisture into the internal space of the OLED device.

As evidenced from the foregoing discussion, it is desirable to provide an improved method of encapsulating OLED devices to protect the device layers from potentially deleterious components such as water and reactive gases.

SUMMARY OF THE INVENTION

The invention relates to a method of encapsulating devices, particularly those which require protection from moisture and gases, such as OLEDs. A getter layer is provided to protect the active components from damage caused by reaction with surrounding moisture and gases. In one embodiment, the getter layer comprises alkaline earth metals. The getter layer is deposited on the substrate using flash evaporation. High evaporation rates are achieved, hence reducing tact time and improving the efficiency of the fabrication process.

PREFERRED EMBODIMENTS OF THE INVENTION

Figure 1:
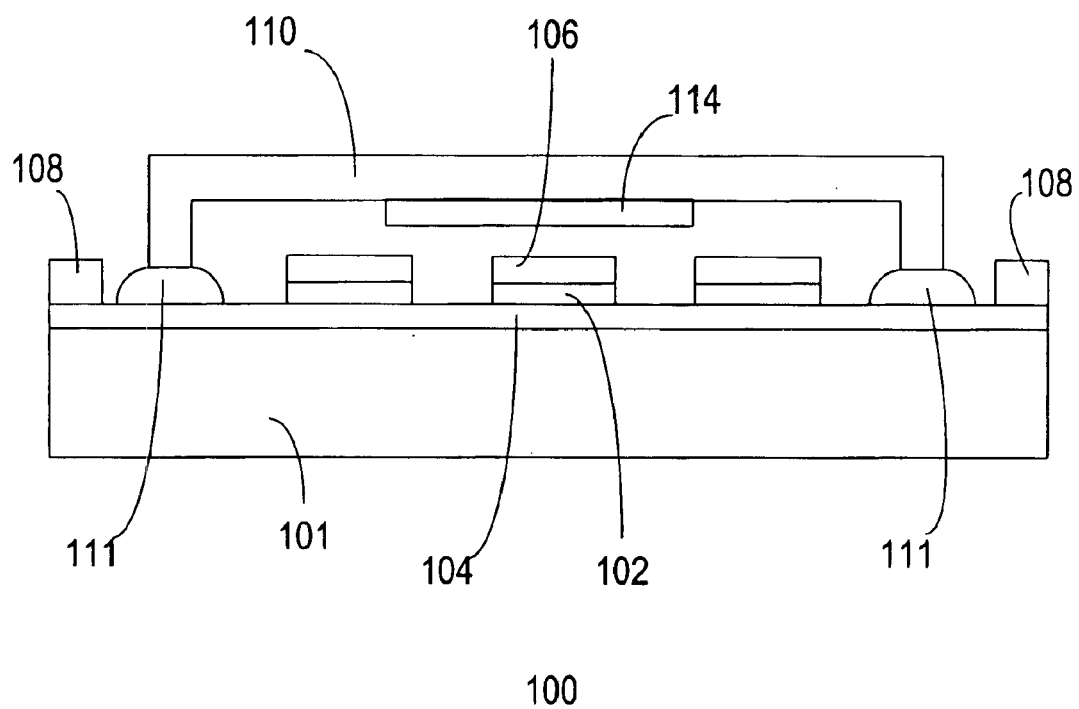
FIG. 1 shows a conventional OLED device.
Figure 2:
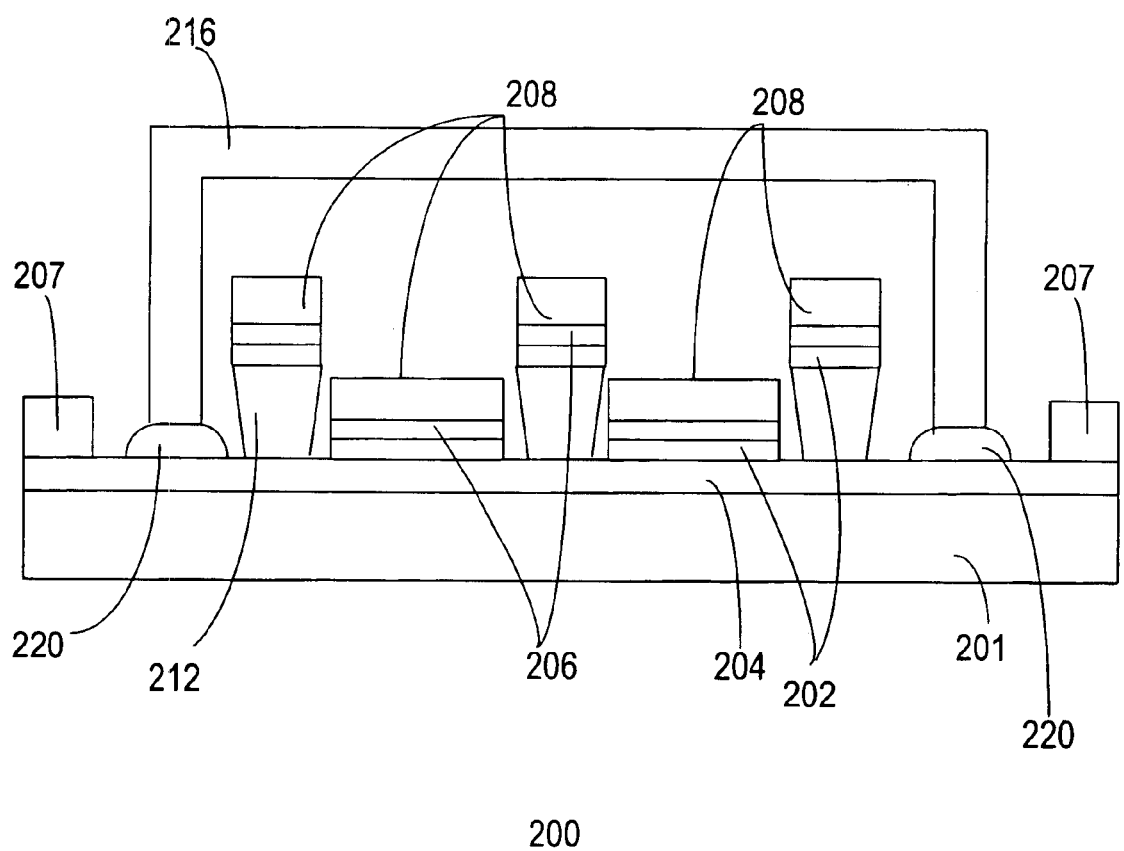
FIG. 2 shows an OLED device in accordance with one embodiment of the invention.

The invention relates to an improved method of encapsulation of devices to protect the materials of the active component or components from atmospheric elements such as moisture and/or gases. FIG. 2 shows an OLED device 200 in accordance with one embodiment of the invention. In one embodiment, the device 200 comprises a substrate 201 having an active region defined thereon. The substrate comprises, for example, glass. Materials, such as silicon or other semiconductor materials, are also useful. To form flexible devices, materials such as plastics, can be used. Various other materials, which can provide sufficient mechanical stability for forming the device, are also useful.

The active region comprises one or more active components of the device. In one embodiment, the active components comprise organic materials which require protection from moisture and/or atmospheric gases. The organic materials, for example, are conductive polymers or molecules. The organic materials are used to form electronic components, such as transistors, to form circuitry for different electronic applications, such as sensors, receivers, displays, or other applications. Other types of materials, such as metals, may also require protection from atmospheric elements. The active components can be used to form various types of devices, such as electrical or electromechanical devices. Forming other types of devices is also useful.

In a preferred embodiment, the active region comprises one or more OLED cells for forming an OLED device. The OLED device can serve as a display or other purposes, such as lighting applications. In one embodiment, the substrate comprises a transparent substrate, such as glass or plastic. The substrate is typically about 0.4–1.1 mm thick. In one embodiment, the substrate comprises a flexible material, such as a plastic film for forming a flexible device. Various commercially available plastic films can be used to serve as the substrate. Such films, for example, include transparent poly(ethylene terephthalate) (PET), poly(butylene terephthalate) (PBT), poly(enthylene naphthalate) (PEN), polycarbonate (PC), polyimides (PI), polysulfones (PSO), and poly(p-phenylene ether sulfone) (PES). Polymeric materials advantageously enable fabrication of devices using a roll-to-roll process. Alternatively, materials such as ultra thin glass (e.g., thickness between 10–100 µm), a composite stack comprising glass and polymer or polymer films coated with inorganic barrier layers can also be used. Other types of materials that can serve as a substrate to support the cells are also useful.

In one embodiment, the OLED cells comprise one or more organic layers 202 sandwiched between lower and upper electrodes. In one embodiment, the lower electrodes 204 are anodes and the upper electrodes 206 are cathodes. Forming lower electrodes that are cathodes and upper electrodes that are anodes is also useful. The organic layers are fabricated from organic compounds that include, for example, conjugated polymers, low molecular materials, oligomers, starburst compounds or dendrimer materials. Such materials include tris-(8-hydroxyquinolate)-aluminum (Alq), poly(p-phenylene vinylene) (PPV) or polyfluorene (PF). Other types of functional organic layers, including fluorescence or phosphorescence-based layers, are also useful. The thickness of the organic layer or layers is typically about 2–200 nm.

The anodes are formed from a conductive material. In one embodiment, the conductive material comprises a transparent conductive material such as indium-tin-oxide (ITO). Other transparent conductive materials, for example, indium-zinc-oxide, zinc-oxide or tin-oxide, are also useful. In one embodiment, the cathodes comprise, for example, low work function metals such as lithium (Li), calcium (Ca), magnesium (Mg), aluminum (Al), silver (Ag) and/or barium (Ba), or a mixture or alloy thereof. These metals are highly reactive with water and gaseous content in the atmosphere and must be protected to provide reliability and prolong the useful life span of the device. A thin electron-injecting layer may be provided between the cathode metal and the organic layer for improving, for example, the drive voltage and luminescence efficiencies. The electron-injecting layer comprises, for example, a metal or alloy, or a dielectric compound. These include CsF, $Cs_2O$, NaF, $MgF_2$, NaCl, KCl, $K_2O$ or RbCl.

Various deposition techniques, such as thermal evaporation, may be used to deposit the electrodes. In one embodiment, the electrodes are patterned as strips in, for example, passive-matrix display applications. In one embodiment, pillars 212 are provided on the substrate surface to pattern the device layers as desired to create separate OLED cells. Other methods of patterning the device layers, including photolithography and etching, are also useful.

Typically, the upper and lower electrodes are patterned in first and second directions that are orthogonal to each other. The intersections of the upper and lower electrodes form the OLED cells or pixels. Pixels are addressed by applying a voltage to corresponding rows and columns. Alternatively, the OLED display comprises an active-matrix display. The active-matrix display comprises pixels that are independently addressed by thin-film-transistors (TFTs) and capacitors formed in an electronic backplane. Bond pads or electrical contacts 207 are electrically coupled to the cathodes and anodes.

In one embodiment, pillars 212 are provided on the substrate surface to pattern the device layers as desired to create separate OLED cells. For example, the pillars are arranged in a second direction to pattern the upper electrode layer to form an array of OLED cells. Pillars which create other patterns for the upper electrodes are also useful. OLED cells are located between the pillars where the upper electrodes overlap the lower electrodes.

The profile of the pillars, in one embodiment, comprises an undercut, which results in structures wider at the top than at the bottom. The profile of the pillars, in one embodiment, comprises tapered sides to provide the undercut. The taper angle is, for example, about 30–75 degrees from horizontal. Other types of profiles, such as t-shaped profiles, are also useful. The height of the pillars is about 1–10 µm and preferably about 2–5 µm. The pillars typically comprise a resist or resin. Various patterning methods such as photolithography, etching or electron curing may be used to form pillars with the desired cross-section.

A cap 216 is provided to hermetically seal the device. The cap, in one embodiment, comprises glass. Other materials, such as metal, ceramic or plastics, can also be used. The cap can be preformed using various techniques, such as etching or stamping, depending on the type of material used. Alternatively, the cap can be a substrate having support posts formed thereon. The support post can be formed by depositing a layer of material and patterning it. Various types of materials, including photosensitive and non-photosensitive materials, such as resist, polyimide, silicon dioxide, can be used. Preferably, the material used is non-conductive. Depending on whether a photosensitive or non-photosensitive material is used, the layer is directly or indirectly patterned with a mask layer. Alternatively, the posts can be formed by selective deposition using, for example, a shadow mask.

In one embodiment, the cap is mounted onto a bonding region of the substrate. In one embodiment, a protective layer can be provided in the bonding region to protect the layers beneath. In a preferred embodiment, the protective layer comprises an insulating material. The use of an insulating material is useful to prevent shorting of conducting lines which provide electrical access to the device. For some applications, a dielectric protective layer may be required in the bonding region to prevent conductive lines on the substrate in the bonding region from being shorted when a conductive cap or conductive post is used. The protective layer comprises, for example, photoresist or photosensitive polyimide. The use of protective layer in the bonding region is described in copending patent application "Improved Encapsulation for Electroluminescent Devices", U.S. Ser. No. 10/142,208 filed on May 7, 2002, which is herein incorporated by reference for all purposes. Alternatively, other dielectric materials, such as silicon oxide, silicate glass, or silicon nitride, are also useful. If an insulating material is not required, a conductive material can be used to form the protective layer.

To bond the cap to the bonding region, a sealant 220 is applied around or on the cap. The sealant, for example, comprises UV-curable epoxy. Other types of sealants such as heat curable epoxy or acrylates are also useful. The sealant, for example, is cured (e.g., UV or thermal), thus sealing the OLED device 200. The sealant, however, may be porous to the surrounding moisture and gases in the atmosphere. Small amounts of such potentially deleterious atmospheric components may be trapped in the device or diffuse through the sealant over time.

In one embodiment of the invention, a layer of getter material 208 is provided to protect the active components, such as the OLED cells, from degradation caused by moisture and reactive gases. The getter layer and the upper electrode layer may be patterned by the pillars to provide distinct portions on top of the pillars and between the pillars. Generally, the thickness of the getter layer depends on the thicknesses of the device layers and the type of OLED devices fabricated. In one embodiment, the total thickness of the organic, upper electrode and getter layers is less than or equal to the height of the pillars to prevent electrical shorting. The thickness of the getter layer is, for example, about 1–3 μm. Alternatively, if pillars are not used to pattern the device layers in, for example, active-matrix display applications, a thicker getter layer may be used. The thickness of the getter layer is, for example, about 30 μm.

In one embodiment, the getter material comprises alkaline earth metals, such as aluminum (Al), magnesium (Mg), zirconium (Zr), calcium (Ca), tantalum (Ta) or barium (Ba). Preferably, the getter material comprises barium. It has been found that alkaline earth metals are constantly reactive, which prevents the formation of mechanically stable oxide films on the surface that may inhibit further sorption. The getter material is capable of absorbing both water and gases such as carbon dioxide, carbon monoxide, nitrogen and oxygen. The use of a getter layer is described in concurrently filed patent application "OLED Devices with Improved Encapsulation" U.S. Ser. No. 10/242,004, which is herein incorporated by reference for all purposes. In one embodiment shown in FIG. 2, the layer of getter material is deposited directly on the active region, covering the active components.

The deposition of alkaline earth metal layers conventionally comprises standard deposition techniques like thermal evaporation, sputtering or electron beam evaporation out of blocks of pure metal. However, pure metal blocks are highly reactive at room temperature with water and gases, and require careful handling in an inert atmosphere filled with, for example, inert gases such as argon. The deposition rate of these conventional techniques is slow, typically at about 1–20 Angstroms per second.

Figure 3:
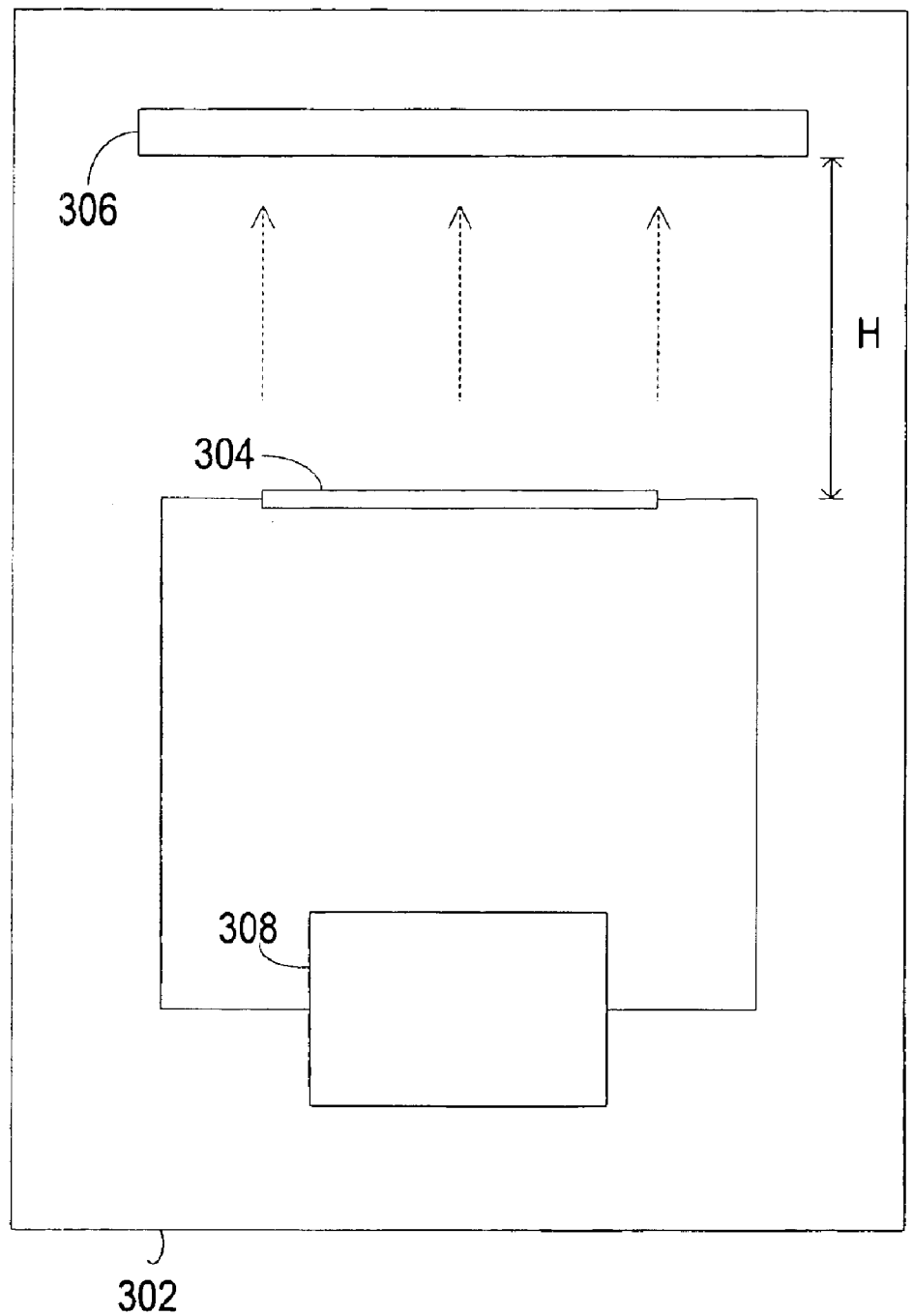
FIG. 3 shows an apparatus for fabricating an OLED device according to one embodiment of the invention.

In accordance with the invention, the getter layer is deposited using a flash evaporation technique. FIG. 3 shows a flash evaporation apparatus 300 according to one embodiment of the invention. The flash evaporation apparatus comprises a vacuum chamber 302, at least one getter source 304 and a heater 308 to activate the getter source.

The pressure in the vacuum chamber is, for example, less than $10^{-4}$ Pa. The getter source and the device 306 are aligned in the vacuum chamber such that a high percentage of the evaporated metal is deposited on the device. In one embodiment, the getter source is aligned below the substrate for bottom-up evaporation to prevent any impurities from falling onto the substrate. A distance H is provided between the substrate and the getter source. The distance H is preferably sufficient to prevent heat emitted from the getter source from damaging the device. In one embodiment, H is about 3–50 cm. In one embodiment, a mask is provided between the getter source and the substrate to selectively deposit the getter layer onto the device.

The getter source may be supported by a holder. In one embodiment, the getter source comprises a stable alloy of the alkaline earth metal, which is inert at room temperature and do not have to be handled in an inert atmosphere. For example, pure barium may be flash-evaporated from alloys of barium with other metals such as magnesium, aluminum, tantalum, thorium, strontium or calcium. In one embodiment, commercially available getters from companies such as SAES Getters are used. In one embodiment, the getter source comprises a wire filled with the getter alloy. Alternatively, other forms of getters such as rings or stirrups may be used.

The getter source is heated up by the heater 308 to the evaporation temperature (e.g. 1000 degrees Celsius). In one embodiment, the heater comprises an electric current supply for passing a current through the getter source. The holder should preferably ensure uniform and reliable electrical contact. Alternatively, the heater comprises conductive coils that heat up the getter source by electromagnetic induction.

The time allowed for evaporation is typically 20–30 seconds. High evaporation rates of, for example, about 1000 Angstroms per second, may be achieved. For example, getter layers with thicknesses of 1–10 μm can be deposited in less than 60 seconds. Hence, tact time is advantageously reduced, improving the efficiency of the fabrication process. After deposition of the getter layer, the device is preferably encapsulated immediately to prevent any unwanted consumption of the getter layer.

In one embodiment, mass production using roll-to-roll production (also known as "web" processing) is employed, where the getter material and other device layers are continuously or semi-continuously deposited on a flexible substrate translated between two reels. Other types of production processes, such as batch processing, are also useful.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. A method of encapsulating an organic device, comprising:
   providing a substrate having an active region defined thereon, the active region comprising an active component;
   flash evaporating a getter layer on a surface of the active component in the active region, the getter layer comprising an alkaline earth metal; and
   mounting a cap onto the substrate to seal the active region.

2. A method of encapsulating an organic device comprising:
   providing a substrate having an active region defined thereon, the active region comprising an active component, wherein the active component comprises at least one OLED cell to form an OLED device;
   flash evaporating a getter layer on the active component, the getter layer comprising an alkaline earth metal; and
   mounting a cap onto the substrate to seal the active region.

3. The method of claim 1 wherein the substrate comprises a flexible material.

4. The method of claim 1 wherein the substrate comprises a transparent material.

5. The method of claim 2 wherein:

the substrate comprises a transparent material; and the active component comprises at least one OLED cell to form an OLED device.

6. The method of claim 5 wherein the getter layer comprises barium.

7. The method of claim 1 wherein the getter layer comprises barium.

8. A method of encapsulating an organic device, comprising:

providing a substrate having an active region defined thereon, the active region comprising an active component;

aligning the substrate and at least one getter source in a vacuum chamber;

activating the getter source;

flash evaporating a getter layer on a surface of the active component located in the active region, the getter layer comprising an alkaline earth metal; and mounting a cap onto the substrate to seal the active region.

9. The method of claim 8 wherein the vacuum chamber is at a pressure of less than $10^{-4}$ Pa.

10. The method of claim 8 wherein the getter source is aligned below the substrate for bottom-up evaporation.

11. The method of claim 10 wherein a distance H is provided between the substrate and the getter source.

12. The method of claim 11 wherein H is about 3–50 cm.

13. The method of claim 10 wherein a mask is provided between the getter source and the substrate.

14. The method of claim 13 wherein the getter source is supported by a holder.

15. The method of claim 8 wherein the getter source comprises a stable alloy of the alkaline earth metal.

16. The method of claim 15 wherein the getter layer comprises barium.

17. The method of claim 15 wherein the getter source comprises a wire filled with the stable alloy.

18. The method of claim 15 wherein the getter source comprises a ring or a stirrup.

19. The method of claim 8 wherein the step of activating the getter source comprises heating the getter source using a heater.

20. The method of claim 19 wherein the step of heating the getter source comprises heating the getter source to an evaporation temperature.

21. The method of claim 19 wherein the heater comprises an electric current supply for passing a current through the getter source.

22. The method of claim 21 wherein the heater further comprises conductive coils.

23. A method of encapsulating an organic device comprising:

providing a substrate having an active region defined thereon, the active region comprising an active component, wherein the active component comprises at least one OLED cell to form an OLED device;

aligning the substrate and at least one getter source in a vacuum chamber;

activating the getter source;

flash evaporating a getter layer on the substrate, the getter layer comprising an alkaline earth metal; and mounting a cap onto the substrate to seal the active region.

24. The method of claim 23 wherein the getter layer comprises barium.

25. The method of claim 24 wherein the getter source is aligned below the substrate for bottom-up evaporation.

26. The method of claim 25 wherein a distance H is provided between the substrate and the getter source.

27. A method of encapsulating a device comprising:

providing a substrate having an active region defined thereon, the active region comprising an active component, the active component including at least one OLED cell;

forming a getter layer on a surface of the active component; and mounting a cap onto the substrate to seal the active region.

28. The method of claim 27 wherein forming the getter layer comprises flash evaporation.

29. The method of claim 27 wherein the getter layer comprises an alkaline earth metal.

30. An organic electronic device, comprising:

a substrate, having an active region defined thereon, the active region including an active component;

a getter layer deposited directly on the active region, the getter layer including an alkaline earth metal; and a cap mounted over the active region to seal the active region.

31. The device of claim 30, wherein:

the active component includes at least one OLED cell.

32. The device of claim 31, wherein:

the active component comprises a plurality of OLED cells, each cell comprising one or more organic layers sandwiched between a lower electrode and an upper electrode;

pillars are provided on the substrate in the active region to pattern the upper electrodes of said plurality of OLED cells into distinct portions; and the getter layer is deposited on the upper electrode.

* * * * *

UNITED STATES PATENT AND TRADEMARK OFFICE
CERTIFICATE OF CORRECTION

PATENT NO.         : 6,887,733 B2                                           Page 1 of 1
APPLICATION NO. : 10/242068
DATED              : May 3, 2005
INVENTOR(S)        : Hagen Klausmann and Bernd Fritz It is certified that error appears in the above-identified patent and that said Letters Patent is hereby corrected as shown below:

Column 1,
Lines 8-9, replace "U.S. Ser. No. 10/242,004, entitled "ENCAPSULATION FOR ORGANIC DEVICES" by Hagen Kiausmann, Yuen" with
-- U.S. Ser. No. 10/242,266, entitled "ENCAPSULATION FOR ORGANIC DEVICES" by Hagen Klausmann, Yuen --.

Signed and Sealed this

Fourth Day of July, 2006

JON W. DUDAS
*Director of the United States Patent and Trademark Office*